(12) United States Patent
Weichmann (10) Patent No.: US 12,107,388 B2
(45) Date of Patent: Oct. 1, 2024

(54) VERTICAL CAVITY SURFACE EMITTING LASER WITH INTEGRATED PHOTODIODE

(71) Applicant: TRUMPF Photonic Components GmbH, Ulm (DE)

(72) Inventor: Ulrich Weichmann, Aachen (DE)

(73) Assignee: TRUMPF PHOTONIC COMPONENTS GMBH, Ulm (DE)

( * ) Notice: Subject to any disclaimer, the term of this patent is extended or adjusted under 35 U.S.C. 154(b) by 603 days.

(21) Appl. No.: 17/334,836

(22) Filed: May 31, 2021

(65) Prior Publication Data
US 2021/0376560 A1    Dec. 2, 2021

(30) Foreign Application Priority Data

Jun. 2, 2020    (EP) ................................. 20177802

(51) Int. Cl.
*H01S 5/183*    (2006.01)
*H01S 5/026*    (2006.01)

(52) U.S. Cl.
CPC ........ *H01S 5/0262* (2013.01); *H01S 5/18361* (2013.01)

(58) Field of Classification Search
CPC ......... H01L 31/035209–03526; H01S 5/0262; H01S 5/0264; H01S 5/183–18397
See application file for complete search history.

(56) References Cited

U.S. PATENT DOCUMENTS

| | | | | |
|---|---|---|---|---|
| 5,389,797 A | * | 2/1995 | Bryan | ............... H01L 31/02327 257/187 |
| 5,498,863 A | * | 3/1996 | Miller | ............... H01L 31/02327 324/645 |
| 5,757,837 A | | 5/1998 | Lim et al. | |

(Continued)

FOREIGN PATENT DOCUMENTS

| | | |
|---|---|---|
| EP | 2277245 A | 1/2011 |
| WO | WO 2004038813 A2 | 5/2004 |
| WO | WO 2009136348 A1 | 11/2009 |

OTHER PUBLICATIONS

Lott, "Design of Vertical Cavity Lasers with Intracavity Photodetectors," *Electronics Letters* 33, 11, pp. 955-957, May 22, 1997, Institute of Electrical and Electronics Engineers, Piscataway, NJ, USA.

(Continued)

*Primary Examiner* — Tod T Van Roy
*Assistant Examiner* — Fernanda Adriana Camacho Alanis
(74) *Attorney, Agent, or Firm* — LEYDIG, VOIT & MAYER, LTD.

(57) ABSTRACT

A vertical cavity surface emitting laser (VCSEL) emits laser light. The VCSEL has an optical resonator and a photodiode. The optical resonator has: a first mirror, an active region configured to generate laser light, and a second mirror. The active region is arranged between the first mirror and the second mirror. The photodiode is integrated in the optical resonator. The photodiode has: an absorption region having a plurality of absorbing layers configured to absorb the (Continued)

generated laser light. The absorbing layers are arranged spaced apart from one another by a distance d which satisfies the condition: $d=(2k-1)\lambda/(4m)$. Where $\lambda$ is the wavelength of the laser light in the absorption region, and k and m are natural numbers $\geq 1$.

14 Claims, 8 Drawing Sheets

(56) References Cited

U.S. PATENT DOCUMENTS

2008/0117947 A1* 5/2008 Masui .................. H01L 31/101
                                                              372/50.21
2019/0386461 A1   12/2019 Johnson et al.

OTHER PUBLICATIONS

Fritz, et al., "Dependence of Critical Layer Thickness on Strain for in $_x$Ga$_{1-x}$As/GaAs Strained-Layer Superlattices," *Applied Physics Letters* 46, 10, pp. 967-969, May 15, 1985, American Institute of Physics, College Park, MD, USA.

Martin Grabherr et al, "Integrated photodiodes complement the VCSEL platform," Vertical-Cavity Surface-Emitting Lasers XIII, Feb. 6, 2009, pp. 1-9, Proceedings vol. 7229, SPIE, Bellingham, WA USA.

* cited by examiner

Fig. 13 though the European Patent Application
VERTICAL CAVITY SURFACE EMITTING LASER WITH INTEGRATED PHOTODIODE

CROSS REFERENCE TO RELATED APPLICATIONS

This application claims benefit to European Patent Application No. EP 20177802.4, filed on Jun. 2, 2020, the entirety of which is hereby incorporated by reference herein.

FIELD

The invention relates to a Vertical Cavity Surface Emitting Laser (VCSEL) with integrated photodiode. The invention further relates to an optical sensor comprising such a VCSEL. Still further, the invention relates to a method of producing such a VCSEL.

BACKGROUND

VCSELs with an integrated photodiode, commonly denoted as ViPs, may be used as miniaturized sensors for the measurement of, e.g. distances, displacements, velocities, or even particle densities. All these measurements may be based on the principle of self-mixing interference (SMI). Optical sensors of this type might be simple enough to be even integrated in mobile phones.

ViPs may be designed such that they operate at a wavelength in a range from about 850 nm to about 1200 nm. For such long wavelength operation of ViPs, strained semiconductor material, for example InGaAs, has to be used for the absorption region of the photodiode. However, the inventors have recognized that, when using strained semiconductor material for an absorbing layer of the photodiode, the thickness of such absorbing layer is limited to only a few 10 nm because of the material strain and the ability to grow defect-free layers of such material. To reach a high absorption with such thin layers, these are typically placed at a position within the epitaxial stack of the VCSEL, where the optical intensity is maximum. However, small layer thickness deviations during epitaxial growth of the epitaxial stack of the VCSEL will modify the optical intensity distribution within the VCSEL, and, therefore lead to a varying absorption and accordingly varying performance among ViPs on a same wafer or among individual wafer production lots. In other words, the absorption capability of the photodiode and thus the light detection capability of a conventional ViP is strongly dependent on production tolerances.

SUMMARY

In an embodiment, the present disclosure provides a vertical cavity surface laser (VCSEL) that emits laser light. The VCSEL has an optical resonator and a photodiode. The optical resonator has: a first mirror, an active region configured to generate laser light, and a second mirror. The active region is arranged between the first mirror and the second mirror. The photodiode is integrated in the optical resonator. The photodiode has: an absorption region having a plurality of absorbing layers configured to absorb the generated laser light. The absorbing layers are arranged spaced apart from one another by a distance d which satisfies the condition: $d=(2k-1)\lambda/(4m)$. Where $\lambda$ is the wavelength of the laser light in the absorption region, and k and m are natural numbers $\geq 1$.

BRIEF DESCRIPTION OF THE DRAWINGS

Subject matter of the present disclosure will be described in even greater detail below based on the exemplary figures. All features described and/or illustrated herein can be used alone or combined in different combinations. The features and advantages of various embodiments will become apparent by reading the following detailed description with reference to the attached drawings, which illustrate the following.

DETAILED DESCRIPTION

Embodiments of the present invention provide an improved Vertical Cavity Surface Emitting Laser with integrated photodiode, wherein the absorption of the photodiode is less dependent on production tolerances.

Embodiments of the present invention provide an optical sensor with improved light detection characteristics; and thus, enable more exact measurements with the sensor.

Embodiments of the present invention provide a method of producing a VCSEL with integrated photodiode.

According to a first aspect of an embodiment of the present invention, a Vertical Cavity Surface Emitting Laser (VCSEL) is provided. The VCSEL includes:

an optical resonator comprising a first mirror, an active region for generation of laser light, and a second mirror, wherein the active region is arranged between the first and second mirrors; and a photodiode integrated in the optical resonator, the photodiode comprising an absorption region having a plurality of absorbing layers configured to absorb generated laser light, wherein the absorbing layers are arranged spaced apart from one another by a distance d which satisfies the condition: $d=(2k-1)\lambda/(4m)$, wherein $\lambda$ is the wavelength of the generated laser light in the absorption region, and k and m are natural numbers $\geq 1$.

The photodiode of the VCSEL according to embodiments of the invention comprises at least two absorbing layers. The absorbing layers are configured to absorb light at least in a wavelength range which includes the wavelength of the laser light generated by the active region. The at least two individual absorbing layers are arranged spaced apart from one another by a distance d which is an odd multiple of the laser wavelength in the optical resonator divided by a multiple of 4, whereby the absorption of the photodiode is less dependent on production tolerances. The distance d may be taken as the center-to-center distance from an individual absorbing layer to a neighboring absorbing layer. The center of an absorbing layer is understood as the middle of the absorbing layer with respect to its thickness. The space between the individual absorbing layers may be filled with non- or at most low-absorbing semiconductor layers.

The above condition for the distance d between individual absorbing layers should be understood within typical production tolerances of ±20%.

Due to the mirrors on both sides of the active region, the optical intensity within a VCSEL forms a standing wave pattern. The maxima of this pattern are a distance apart from each other that corresponds to half the laser wavelength in the optical resonator. The laser wavelength in the optical resonator, especially in the absorption region of the photodiode, is understood as the laser wavelength in the semiconductor material of the optical resonator, or especially in the absorption region of the photodiode, which is the laser wavelength in air divided by the refractive index of the semiconductor material used in the layer stack forming the optical resonator, or especially the absorption region of the photodiode. For example, when an AlGaAs/GaAs-material system is used to build up the resonator, the refractive index is about 3.5 at a wavelength above 850 nm. InGaAs has a very similar refractive index.

If the photodiode only has one thin absorbing layer, absorption of light generated by the active region is optimum, when the absorbing layer is arranged in an intensity maximum of the standing wave pattern. However, the epitaxial production process may have some spread and thickness deviations from the theoretical design, both across a wafer as well as between individual wafer production lots. These thickness deviations can cause a shift of the standing wave pattern with respect to the photodiode, resulting in a decrease of the overlap between maximum or high optical intensity and absorbing layer. The consequence is a significant decrease of absorption. Thus, production tolerances lead to strongly varying photodiode signals across the wafer or between different wafer production lots.

When, as provided by the invention, the photodiode has at least two absorbing layers spaced apart from one another by a distance d according to the above condition, a relative shift of the standing wave pattern with respect to the photodiode leads to less reduction in absorption in comparison with a design with one absorbing layer only, as will be described herein. Thus, the VCSEL according to embodiments of the invention is much less sensitive to production tolerances.

The absorbing layers of the photodiode may be monolithically integrated in one of the first and second mirrors. The first mirror and/or the second mirror may be configured as distributed Bragg reflectors (DBRs).

Preferentially, the photodiode may comprise an even number of absorbing layers. An even number of absorbing layers is particularly suited for reducing the sensitivity of the photodiode to tolerances in the production of VCSELs. The number of individual absorbing layers may be 2, 4, 6, or more. There can be 2, 4, 6 or more individual absorbing layers arranged within a half of the wavelength of the laser within the absorption region. There can be 2, 4, 6 or more individual absorbing layers within a full wavelength of the laser within the absorption region.

The photodiode may comprise at least two absorbing layers arranged spaced apart from one another by the distance d, wherein k=1 and m=1. In this configuration, at least two individual absorbing layers are arranged spaced apart by a quarter of the wavelength within the optical resonator. In this case, at least two absorbing layers are arranged within a half of the wavelength of the laser within the absorption region.

In an alternative configuration, the photodiode may comprise at least two absorbing layers arranged spaced apart from one another by the distance d, wherein k=2 and m=1. In this configuration, at least two absorbing layers are spaced apart from one another by three quarters of the wavelength within the absorption region. At least two absorbing layers thus are arranged within a full wavelength of the wavelength within the absorption region.

In another configuration, the photodiode may comprise at least four absorbing layers pairwise spaced apart from one another by the distance d, wherein k=1 and m=2. In this configuration, two neighboring of the at least four absorbing layers are spaced apart from one another by an eighth of the wavelength within the optical resonator. In this configuration, at least four absorbing layers are arranged within a half of the wavelength within the absorption region.

The absorbing layers of the photodiode may comprise strained semiconductor material. An embodiment of the present invention is particularly advantageous when strained semiconductor material, like InGaAs, is to be used for the absorbing layers. As mentioned above, such strained semiconductor material allows for producing thin layers only. Therefore, each absorbing layer may have a layer thickness which is in a range from 25% to 200%, preferably in a range from 70% to 100% of a critical layer thickness of the strained semiconductor layer. The critical layer thickness is typically defined as the limit of layer thickness wherein the strain is still elastically accommodated. For example, InGaAs with an indium content of 16.5% has a critical layer thickness of about 18 nm, as disclosed in Fritz et al.: "Dependence of critical layer thickness on strain for In$_x$Ga$_{1-x}$As/GaAs strained-layer superlattices", Appl. Phys. Lett. Vol. 46(10), pages 967-969, 1985.

In exemplary embodiments, the absorbing layers may have a single layer thickness in the range from 5 nm to 50 nm, preferably in a range from 10 nm to 35 nm, e.g. in a range from 15 to 30 nm.

Preferentially, the absorbing layers may comprise In$_x$Ga$_{1-x}$As, with x in a range from 0.05 to 0.3, depending on the wavelength to be output by the VCSEL. The active region may also comprise InGaAs, wherein the indium content in the single absorbing layers preferentially is higher than in the layer or layers of the active region. The active region may comprise GaAs instead of InGaAs.

When one of the first and second mirrors is configured as a DBR, the photodiode may be monolithically integrated in the layer stack of this DBR, thus dividing this DBR in two or more parts. The DBR may comprise AlGaAs or GaAs as the material system.

At least one layer comprising AlGaAs or GaAs or GaAsP may be arranged between adjacent absorbing layers. A GaAs$_y$P$_{1-y}$ layer, e.g. with y>0.5, e.g. >0.8, may be advantageous, as it partially, completely or even over-compensates the strain introduced by the absorbing layers, when these are based on a strained semiconductor material like InGaAs.

Preferentially, at least one first layer comprising AlGaAs or GaAs, and at least one second layer comprising AlGaAs or GaAs, and at least one third layer comprising GaAsP which is sandwiched between the first and second layers comprising AlGaAs or GaAs may be arranged between adjacent absorbing layers.

Further strain-compensating layers may be arranged on one or both sides of the absorption region of the photodiode.

Preferentially, the emission wavelength of laser light output by the VCSEL is in a range from 850 nm to 1200 nm.

The VCSEL may further comprise a contact arrangement arranged to provide an electrical drive current to electrically pump the optical resonator.

According to a second aspect of an embodiment of the present invention, an optical sensor is provided, comprising a Vertical Cavity Surface Emitting Laser according to the first aspect.

The optical sensor may be comprised by a mobile communication device.

The optical sensor may be used for distance detection, velocity detection, particle density detection, gesture control, and especially for all sensor applications which are based on self-mixing interference measurements.

According to a third aspect of an embodiment of the present invention, a method of producing a Vertical Cavity Surface Emitting Laser (VCSEL) is provided, the method comprising:
  providing an optical resonator comprising a first mirror, an active region for generation of laser light, and a second mirror, wherein the active region is arranged between the first and second mirrors,
  integrating a photodiode in the optical resonator, the photodiode comprising an absorption region having at least two absorbing layers, and arranging the absorbing layers spaced apart from one another by a distance d which satisfies the condition: $d=(2k-1)\lambda/(4\ m)$, wherein $\lambda$ is the wavelength of the laser light within the absorption region, and k and m are natural numbers$\geq 1$.

The steps of the method may include depositing layers forming the first and second mirrors, the active region and the photodiode by epitaxial methods like MOCVD, MBE and the like.

The VCSEL may comprise a substrate onto which the layer stack of the VCSEL with integrated photodiode is grown. The substrate may be removed after the VCSEL is produced.

The VCSEL may be a top emitter or a bottom emitter.

It shall be understood that the VCSEL according to any embodiment described above and described below and the method of producing the VCSEL have similar and/or identical embodiments, in particular as defined in the claims. Further advantageous embodiments are defined below.

Embodiments of the present invention provide a VCSEL with monolithically integrated photodiode, wherein the photodiode comprises at least two absorbing layers which are arranged spaced apart from one another by a distance which is an odd multiple of the laser wavelength in the absorption region of the photodiode of the VCSEL divided by a multiple of 4, so that the absorption of the photodiode is less dependent on production tolerances. This will be explained in more detail below.

Figure 1:
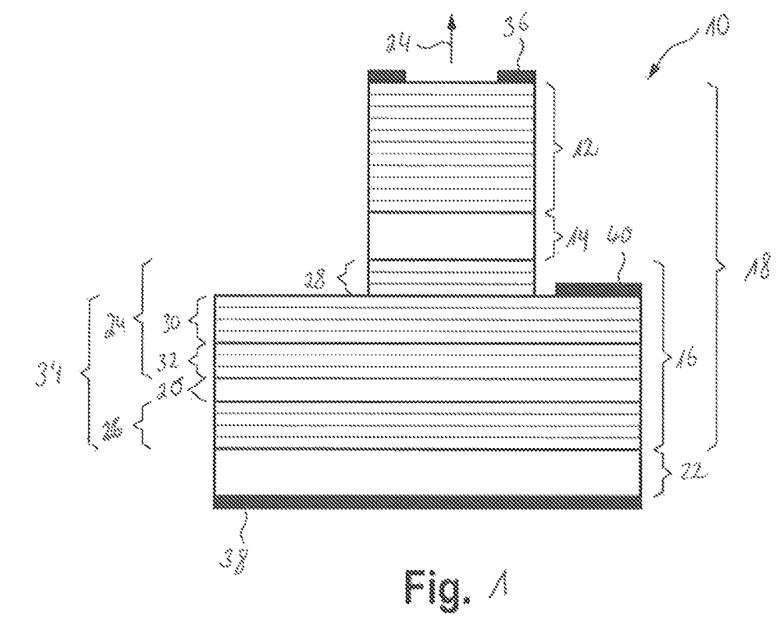
FIG. 1 shows a schematic view of a VCSEL with monolithically integrated photodiode.

With reference to FIG. 1, a general design of a VCSEL with monolithically integrated photodiode will be described. FIG. 1 shows a VCSEL 10. The VCSEL 10 comprises a first mirror 12, an active region 14 for laser light emission, and a second mirror 16. The first mirror 12 and the second mirror 16 may be configured as distributed Bragg reflectors (DBRs). The active region 14 is arranged between the first and second mirrors 12, 14. The first mirror 12, the active region 14 and the second mirror 16 form an optical resonator 18. The VCSEL 10 further comprises a photodiode 34 which comprises a light absorption region 20.

The layer stacks of the first mirror 12, the active region 14, the second mirror 16 and the light absorption region 20 of the photodiode may be epitaxially grown on a substrate 22. The layers of the first and second mirrors 12, 16 may comprise doped AlGaAs semiconductor material.

The VCSEL 10 may be a top emitter, i.e. laser light is emitted by the VCSEL 10 as illustrated by an arrow 24. In case of a top emitter, the first mirror 12 has a reflectivity which is lower than the reflectivity of the second mirror 16. In other embodiments, the VCSEL 10 may be configured as a bottom emitter, i.e. laser light is emitted on the substrate side of the VCSEL 10. In case of a bottom emitter, the reflectivity of the second mirror 16 is lower than the reflectivity of the first mirror 12. The substrate 22 may be removed at least in part.

In the design shown in FIG. 1, the absorption region 20 of the photodiode 34 is monolithically integrated in the second mirror 16. In other embodiments, the light absorption region 20 may be integrated in the first mirror 12.

Figure 2:
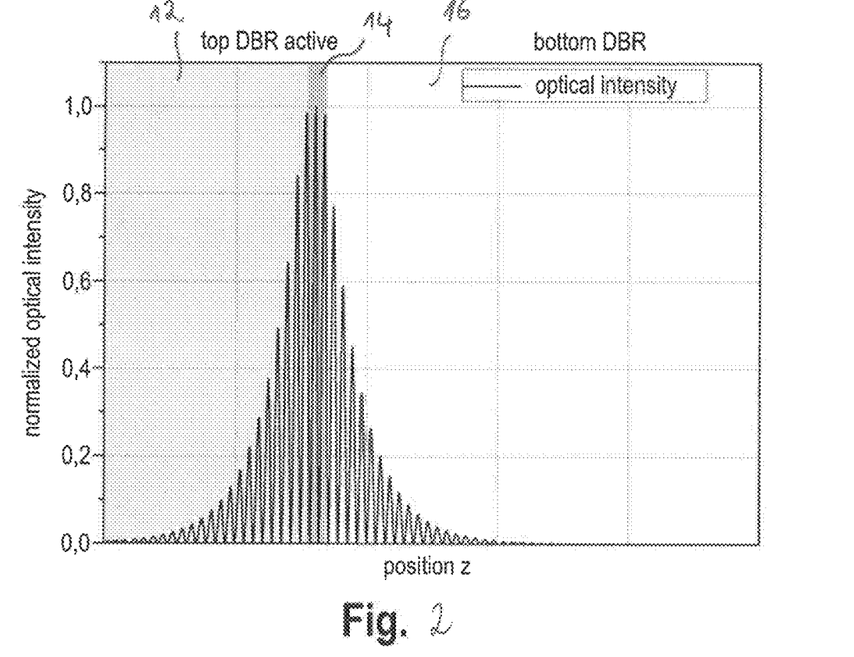
FIG. 2 shows a standing wave pattern of the optical intensity within a VCSEL.

Each of the first and second mirrors 12, 16, when configured as DBRs, may have one or more layer pairs, wherein the two layers of a layer pair have different indices of refraction. The number of layers shown in FIG. 1 is only schematic and exemplary. The thickness of the layers shown in FIG. 2 is not to scale.

The optical resonator 18 may further comprise one or more oxide apertures.

The light absorption region 20 of the photodiode 34 is embedded in the layer stack of the second mirror 16, thus dividing the second mirror 16 in a first part 24 and a second part 26.

The substrate 22 and the second part 26 of the second mirror 16 may be n-doped. The first part 24 of the second mirror 16 may have an n-doped first region 28, an n-doped second region 30, and a p-doped third region 32. The n-doped second region 30, the p-doped third region 32, the light absorption region 20, which preferentially is an entire intrinsic (undoped) region, and the n-doped second part 26 of the second mirror 16 form the photodiode 34. Thus, the photodiode 34 may be an n-p-i-n photodiode formed by the light absorption region 20 and the layers of the regions 30, 32, 26 of the second mirror 16.

The VCSEL 10 comprises an electrical contact arrangement, which may comprise a p-contact 36 on top of the first mirror 12, an n-contact 38 on the bottom of the substrate 22, and a further n-contact 40 on top of the region 28 of the second mirror 16. The p-contact may be formed as a ring electrode. The p-contact 36 may be arranged on a cap layer on top of the first mirror 12. The n-contact 38 may be formed as a metallization of the bottom of the substrate 22. In case the VCSEL 10 is designed as a bottom emitter, the n-contact 38 may be formed as a ring electrode.

The p-contact 36 may form the anode of the VCSEL, and the n-contact 40 may form the cathode of the VCSEL 10. At the same time, the n-contact 40 may form the anode of the photodiode 34, while the n-contact 38 may form the cathode of the photodiode 34.

The VCSEL 10 is preferably designed to output laser light in a wavelength range from 850 nm to 1200 nm. In order to obtain emission with such a long wavelength, the InGaAs-material system may be preferred for the active region 14 as well as for the absorption region 20. For example, the active region 14 may comprise one or more InGaAs layers. The higher the indium content, the higher the laser light emission wavelength. For example, an InGaAs composition with 10% indium content may provide laser emission at about 950 nm at a temperature of about 300 K. For smaller emission wavelengths, e.g. 850 nm, the active region 14 may comprise one or more GaAs layers. The indium content of an absorbing layer in the absorption region 20 is preferentially higher than the indium content in the active region 14.

InGaAs is a strained semiconductor material. The strain depends on the amount of the indium content in the compound and limits the layer thickness that can be grown defect-free to only a few 10 nm. This is small as compared to the period of the typical variation of the optical intensity in the VCSEL 10, which follows a standing wave pattern due to the mirrors 12, 16 on both sides of the active region 14, as shown in FIG. 2. FIG. 2 shows the normalized optical intensity within the optical resonator 18 of the VCSEL 10 as function of the position z along the layer stack from the first mirror to the second mirror of the VCSEL. The optical intensity is highest in the active region and decreases towards the DBRs 12 and 16.

Figure 3:
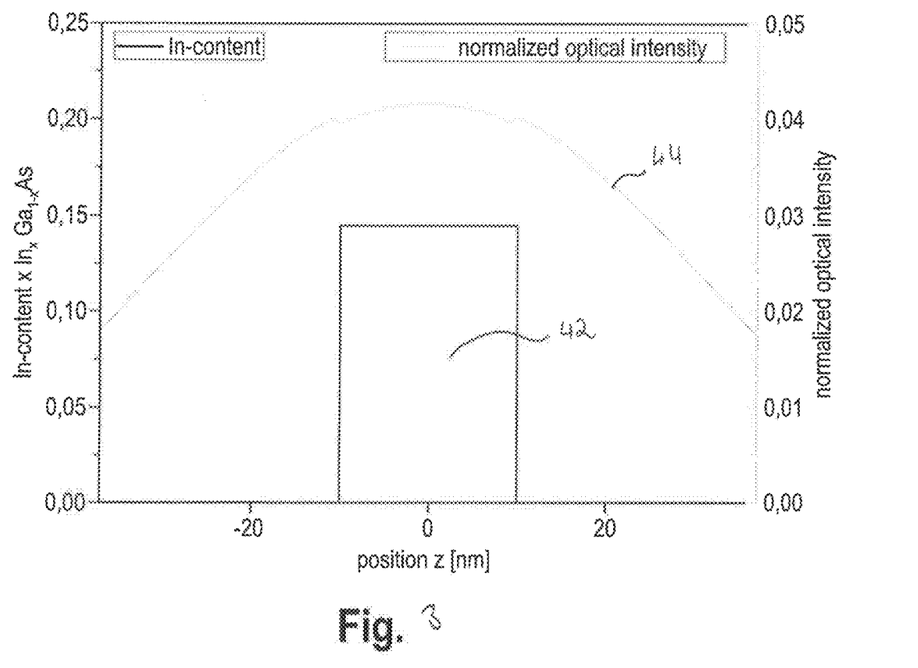
FIG. 3 shows a single thin absorbing layer of a photodiode placed at the maximum of the optical intensity within a VCSEL.

FIG. 3 shows a diagram, in which a single absorbing layer 42 made of InGaAs with an indium content of about 15% and a thickness of 20 nm is placed centered to a maximum of optical intensity in the optical resonator of the VCSEL. As can be seen in FIG. 3, the thickness of the single absorbing layer 42 is much smaller than the typical variation of the optical intensity 44. When the single absorbing layer 42 is centered with respect to the optical intensity maximum, as shown in FIG. 3, the photodiode signal is maximum. However, when producing a VCSEL, the epitaxial production process will have some spread and thickness deviations from the theoretical design, both across a wafer as well as between individual wafer production lots. These thickness deviations can cause a shift of the standing wave pattern with respect to the absorption region 20 of the photodiode 34, resulting in a decrease of the overlap between maximum optical intensity and absorbing layer. The result is a varying photodiode signal across the wafer and between different production lots. Increasing the thickness of the absorbing layer 42 may be strongly limited, when the absorbing layer 42 is made of a strained semiconductor material, as for example InGaAs with an indium content of e.g. more than 10%.

Therefore, according to the present disclosure, it is proposed to build up the absorption region 20 of the photodiode 34 with more than one absorbing layer, wherein the absorbing layers are arranged such that the absorbing layers are spaced apart from one another by a distance d which satisfies the condition: $d=(2k-1)\lambda/(4m)$, wherein $\lambda$ is the wavelength of the generated laser light in the optical resonator 18, and k and m are natural numbers $\geq 1$. This will be explained in more detail with reference to FIGS. 4 to 9.

In FIGS. 4 to 9, the optical intensity 48 is approximated by a squared sine-function ($\sin^2 x$). For the sake of example, the period of the squared sinus-function has been chosen to be 134 nm, which is typical for a VCSEL with output emission wavelength of 940 nm. It is to be noted that the optical intensity varies with a period which is half the wavelength of the laser light within the VCSEL cavity. A period of the optical intensity variation of 134 nm thus corresponds to a laser light wavelength of 268 nm within the VCSEL cavity.

Figure 4:
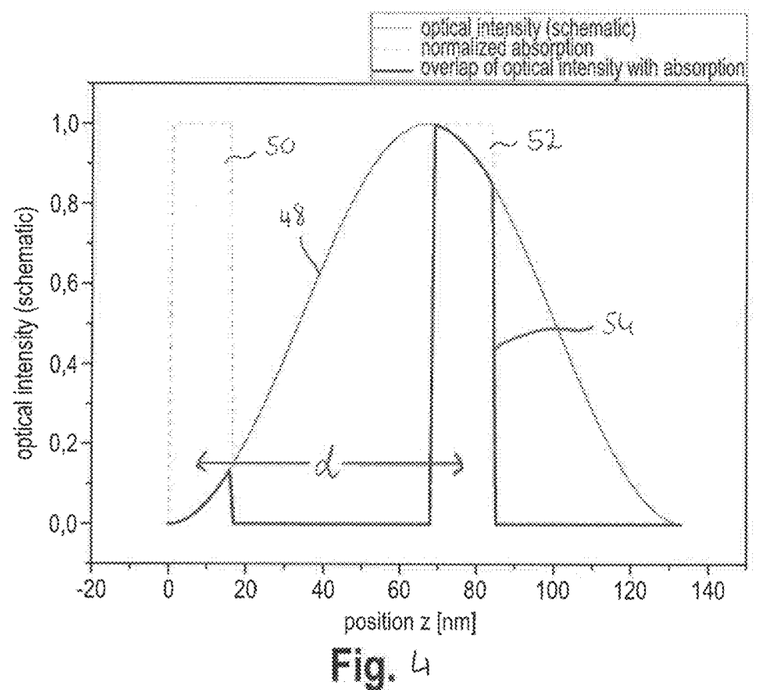
FIG. 4 shows an embodiment of a photodiode of a VCSEL with two absorbing layers.

FIG. 4 shows an embodiment of a photodiode, wherein the absorption region of the photodiode comprises two absorbing layers 50, 52 which are illustrated by broken lines in FIG. 4. For the sake of example, the thickness of each of the individual absorbing layers 50 and 52 has been chosen in this example to be 15 nm. A bold line 54 shows the overlap of the optical intensity curve 48 with the absorption profile provided by the absorbing layers 50 and 52. In this embodiment, the absorbing layers 50, 52 are arranged at a distance d from one another, which is half the period of the optical intensity variation, corresponding to a quarter of the wavelength $\lambda$ in the absorption region. The distance d may be taken as shown in FIG. 4 as the distance from the thickness center of the absorbing layer 50 to the thickness center of the absorbing layer 52. The distance d can also be taken from the beginning of the absorbing layer 50 to the beginning of the absorbing layer 52, or from the end of the absorbing layer 50 to the end of the absorbing layer 52 (seen from left to right in FIG. 4).

In FIG. 4, the relative spatial relationship between the optical intensity and the absorbing layers 50 and 52 is such that the layer 50 begins at a minimum of the optical intensity and the absorbing layer 52 begins at a maximum of the standing wave pattern.

Figure 5:
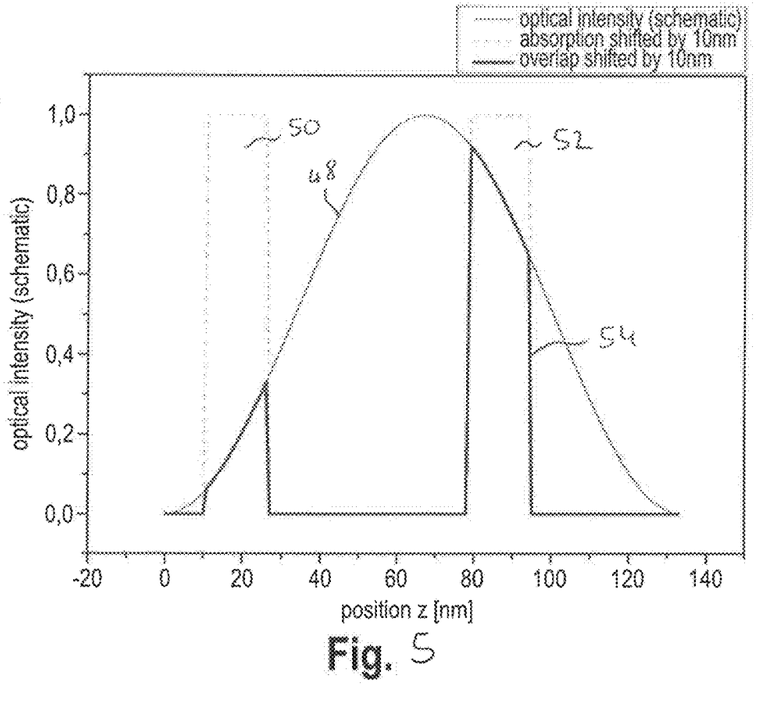
FIG. 5 shows the two absorbing layers of the photodiode in FIG. 4 with a first shift of the standing wave pattern relative to the absorbing layers.

FIG. 5 shows the same two absorbing layers 50 and 52, wherein the absorbing layers 50 and 52 and the optical intensity curve 48 are shifted relative to one another by 10 nm without changing the distance d. Such a shift may be caused by production tolerances. For example, the absorbing layers 50, 52 shown in FIG. 4 and the absorbing layers 50, 52 in FIG. 5 may be absorbing layers of ViPs along a same wafer or of ViPs of different production lots. As can be seen in FIG. 5, while the absorption overlap of the optical intensity with the absorbing layer 52 and thus absorption by the layer 52 has decreased, the absorption overlap of the optical intensity with the absorbing layer 50 and thus absorption by the layer 50 has increased. Thus, the effect of a shift of the standing wave pattern with respect to the absorbing layers 50 and 52 on total absorption is reduced to only a few percent variation in the absorption.

FIG. 6 shows again the photodiode with the two absorbing layers 50 and 52, wherein now a relative shift between the optical intensity curve 48 and the absorbing layers 50, 52 by 30 nm in comparison to the situation in FIG. 4 is illustrated. Again, while the overlap of the optical intensity with the absorbing layer 52 has further decreased, the overlap of the optical intensity with the absorbing layer 50 has further increased so that the effect of the shift of the standing wave pattern on the overall overlap of optical intensity profile and absorption profile again is reduced to only a few percent variation in absorption.

Figure 6:
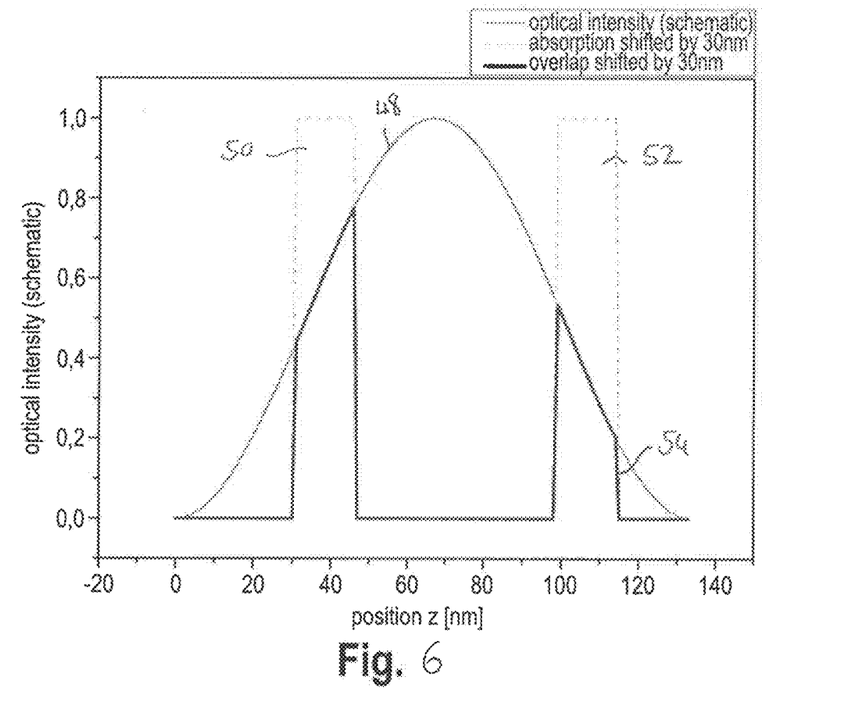
FIG. 6 shows the two absorbing layers in FIG. 4 with a second shift of the standing wave pattern relative to the absorbing layers.
Figure 7:
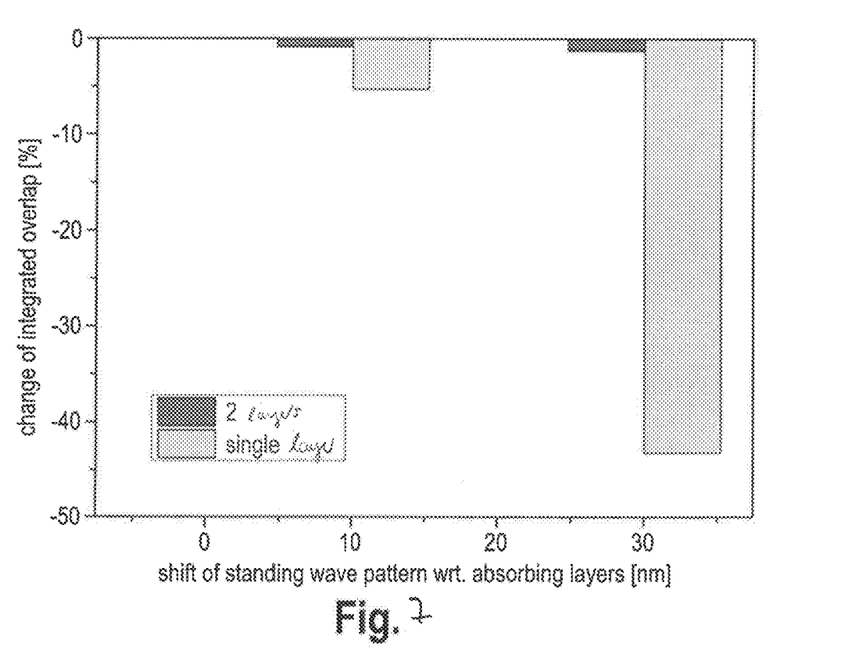
FIG. 7 shows a diagram of the effect of a shift of the standing wave pattern with respect to a photodiode with a single absorbing layer and with respect to a photodiode with two absorbing layers.

This is very different from the situation with only one absorbing layer (FIG. 3), where the same shift of the standing wave pattern relative to the photodiode 34 leads to a reduction in absorption of more than 40%, as shown in FIG. 7. FIG. 7 shows a comparison of the change of integrated overlap for a shift by 10 nm and 30 nm of the standing wave pattern with respect to a photodiode having a single absorbing layer as shown in FIG. 3, and with respect to a photodiode having two absorbing layers like absorbing layers 50 and 52 in FIGS. 4 to 6.

Figure 8:
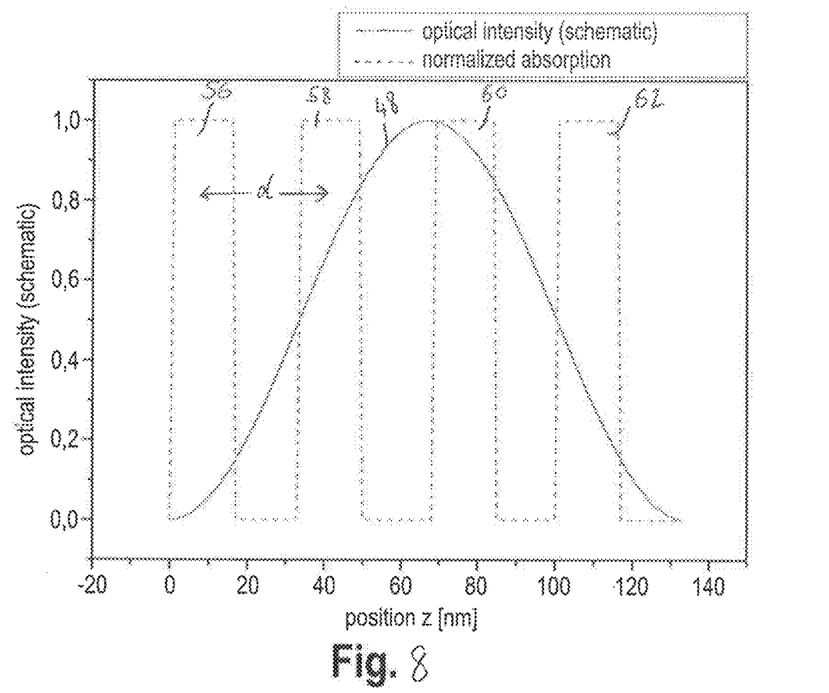
FIG. 8 shows an embodiment of a photodiode of a VCSEL with four absorbing layers.

FIG. 8 shows another embodiment of a photodiode with an absorption region comprising four absorbing layers 56, 58, 60 and 62. Neighboring ones of the absorbing layers 56, 58, 60, 62 are arranged spaced apart by a distance d which is an eighth of the wavelength of the laser light in the absorption region 20.

As can be seen in FIGS. 4 to 6, the two absorbing layers 50 and 52 are arranged within half a laser wavelength in the absorption region. As can be seen in FIG. 8, all four absorbing layers 56, 58, 60, 62 are arranged within half a laser wavelength. In other embodiments not shown, six or more absorbing layers can be arranged within half a laser wavelength.

Figure 9:
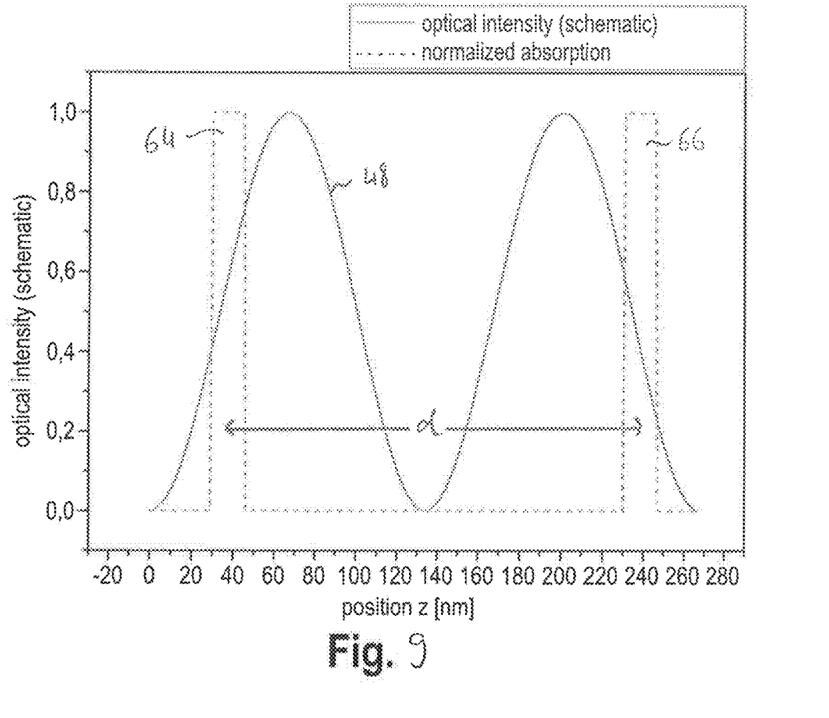
FIG. 9 shows a further embodiment of a photodiode of a VCSEL with two absorbing layers.

FIG. 9 shows an embodiment of a photodiode comprising an absorption region having two absorbing layers 64, 66 which are arranged within a full wavelength of the laser wavelength in the absorption region. The absorbing layers 64, 66 are arranged in a distance d from one another which is three quarters of the wavelength of the laser light in the absorption region.

The embodiments in FIGS. 4 to 6, 8 and 9 are examples for a general condition for the distance d which is connected to the laser wavelength λ in the semiconductor material of the absorption region 20 as follows:

$$d=(2k-1)\cdot\lambda/(4\cdot m) \quad (1)$$

where k and m are natural numbers≥1.

The above condition (1) ween individual absorbing layers should be understood within typical production tolerances of ±20%.

For the embodiment in FIGS. 4, 5 and 6, the natural numbers k and m in the above condition (1) is 1 (k=m=1) and d=67 nm. The embodiment in FIG. 8 shows the above condition (1) with k=1; m=2, with the distance d=34 nm. In the embodiment of FIG. 9, the numbers k and m in the above condition (1) are k=2; m=1, resulting in a distance d of 201 nm.

The above embodiments of absorbing layers of an absorption region of a photodiode as described with reference to FIGS. 4-6, 8 and 9 can be implemented in the absorption region 20 of the photodiode 34 of the VCSEL 10 in FIG. 1.

Preferably, the absorption region 20 of the photodiode 34 comprises an even number of absorbing layers.

The disclosure herein especially applies to VCSELs with monolithically integrated photodiode (ViPs) that use strained semiconductor materials for the absorbing layers of the photodiode. In particular, ViPs with an output emission wavelength between 850 and 1200 nm may be considered.

As a practical example, a ViP with an output emission wavelength of 940 nm will be described. A suitable material for the absorbing layers of the photodiode would be $In_xGa_{1-x}As$ with x=16.5%. According to the above referenced article by Fritz et al.: "Dependence of critical layer thickness on strain for $In_xGa_{1-x}As/GaAs$ strained-layer superlattices"; Appl. Phys. Lett. Vol. 46 (10), p. 967-969, 1985, the critical layer thickness for such a material is about 18 nm. The single layer thickness of the individual absorbing layers should be larger than 25% and smaller than 200% of the critical layer thickness. For example, a good choice would be a thickness of 15 nm (about 83% of the critical layer thickness). With a refractive index of semiconductor material in the absorption region of approximately 3.5 (typical for AlGaAs and InGaAs at a wavelength around 940 nm), the laser wavelength in the semiconductor is λ=268 nm in this example.

Figure 10:
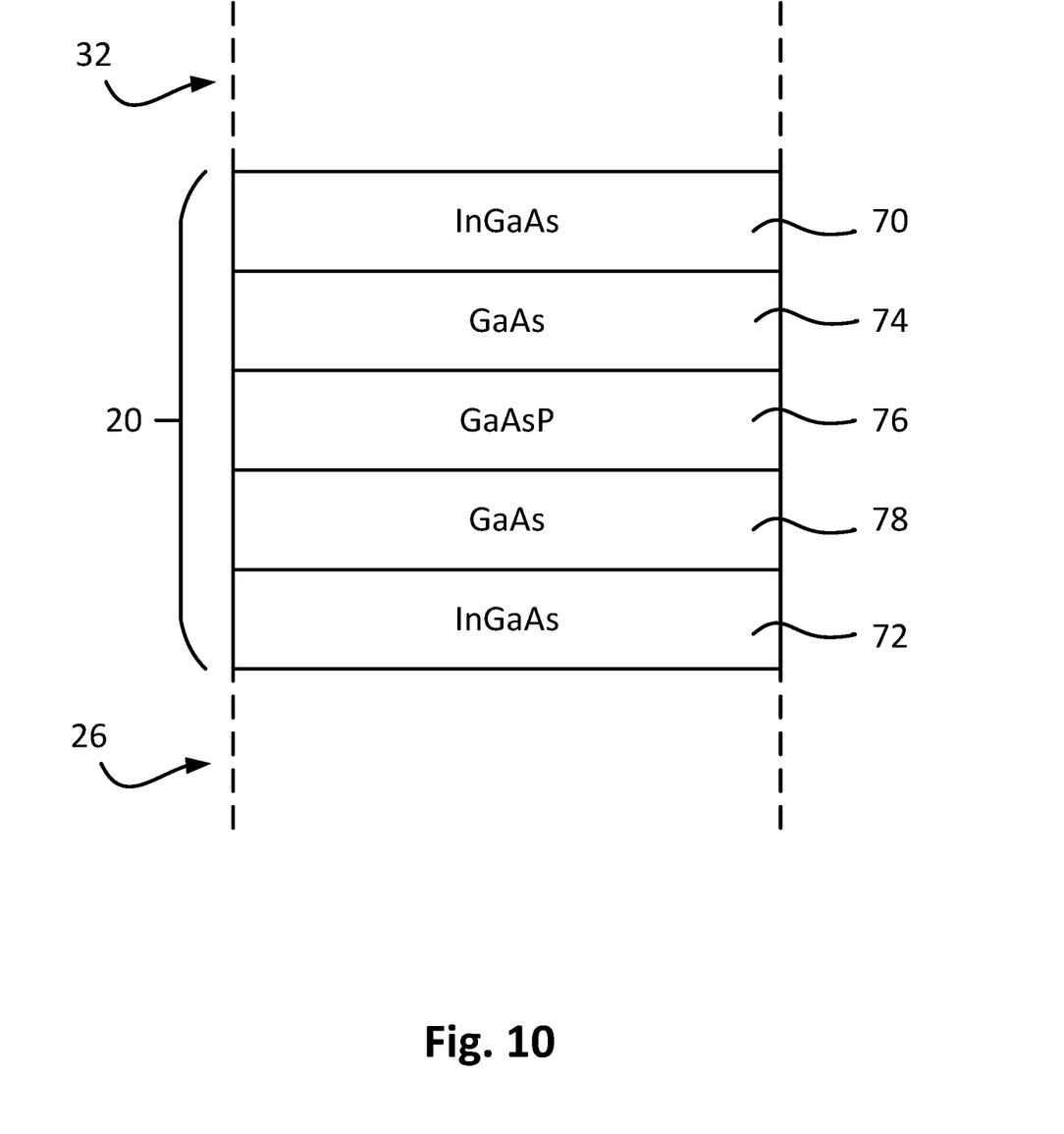
FIG. 10 shows a schematic view of an embodiment of an absorption region of a photodiode of a VCSEL.

FIG. 10 shows an embodiment of the absorption region 20 in FIG. 1 which comprises two absorbing layers 70, 72 and three layers 74, 76, 78 between the absorbing layers 70 and 72. At least one of the layers 74, 76, 78 which are non-absorbing layers comprises a strain-compensating material that partially, completely or even over-compensates the strain introduced by the absorbing layers which preferentially comprise InGaAs. The material between the individual absorbing layers 70, 72 might be AlGaAs or GaAs. The light absorption region preferentially is intrinsic (undoped) in its entirety.

A suitable layer stack of the absorption region 20 may thus comprise two InGaAs absorbing layers 70, 72, a strain-compensating GaAsP layer 76, embedded between two GaAs layers 74, 78. Also indicated in FIG. 10 are the regions 32 and 26 between which the absorption region 20 is arranged.

With the above example of InGaAs absorbing layers with an indium content of 16.5%, the embodiment of FIGS. 4 to 6 in combination with FIG. 10 can be realized with a layer thickness of each of the absorbing layers 70, 72 of 15 nm, a layer thickness of the layer 74 of 3 nm, a layer thickness of the layer 76 of 46 nm, a layer thickness of the layer 78 of 3 nm. The absorbing layers 70, 72 thus are spaced apart by 67 nm, corresponding to a quarter of the laser wavelength within the absorption region.

Variations of the layer structure in FIG. 10 may be envisaged. For example, the GaAs layers could be left out, or further strain-compensating layers could be arranged on both sides of the absorption region 20.

Figure 11:
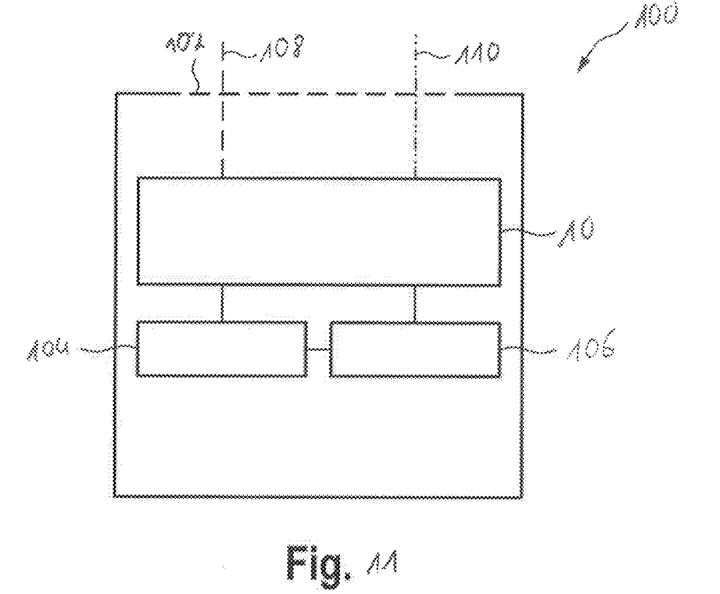
FIG. 11 shows a schematic view of an optical sensor comprising a VCSEL.

FIG. 11 shows a sketch of an optical sensor 100 according to an embodiment. The optical sensor 100 is arranged to determine presence, distances and movements of objects by means of self-mixing interference measurements. The optical sensor 100 comprises a VCSEL 10 with monolithically integrated photodiode as described above, a transmission window 102 and a driving circuit 104 for electrically driving the VCSEL 10. The driving circuit 104 is electrically connected to the VCSEL 10 via the contacts 36 and 40 to supply electrical power to the VCSEL 10 in a defined way. The driving circuit 104 may comprise a memory device for storing data and instructions to operate the driving circuit 104. The optical sensor 100 further comprises an evaluator 106. The photodiode 34 comprised by the VCSEL 10 is arranged to determine variations in the standing wave pattern within the laser cavity which are caused by interference of returning laser light 110, which is based on emitted laser light 108 reflected by respective objects, and the optical wave within the optical resonator 18 of the VCSEL 10. The evaluator 106 may comprise at least one memory device like a memory chip and at least one processing device like a micro-processor. The evaluator 106 is adapted to receive electrical signals from the VCSEL and optionally from the driving circuit 54 to determine distances or movements of one or more objects based on the interference of the returning laser light 110 with the optical wave within the optical resonator 18 of the VCSEL 10 (self-mixing interference). The optical sensor 100 may be used for particle detection, distance/velocity measurements, user interfaces, gesture control, etc.

Figure 12:
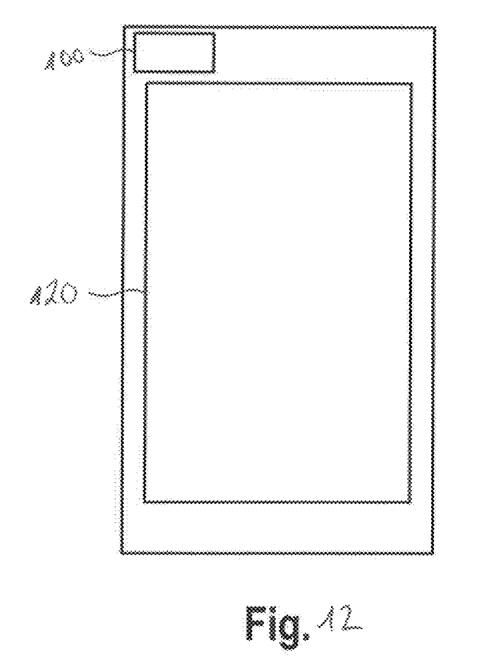
FIG. 12 shows a principle sketch of a mobile communication device comprising an optical sensor.

FIG. 12 shows a sketch of a mobile communication device 120 comprising the optical sensor 100. The optical sensor 100 can, for example, be used in combination with the software application running on the mobile communication device 120. The software application may use the optical sensor 100 for sensing applications. Such sensing applications may, for example, be self-mixing interference measurement applications, in particular particle sensing applications or an application of a gesture recognition based user interface.

Figure 13:
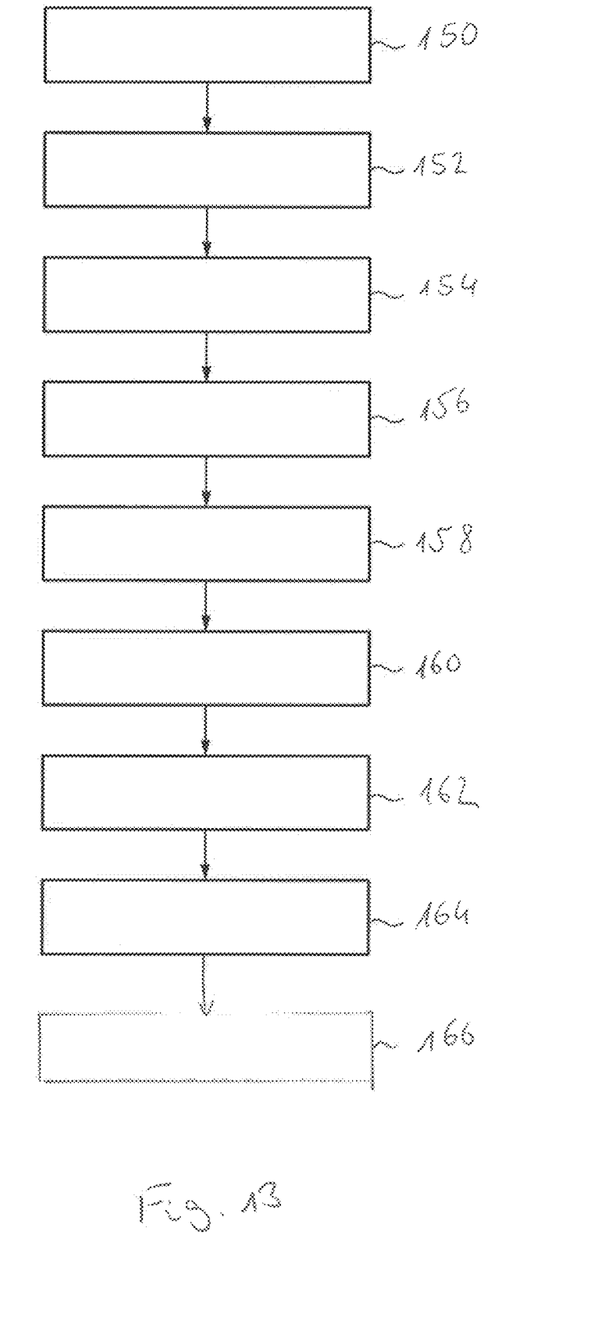
FIG. 13 shows a principle sketch of a process flow of a method of producing a VCSEL.

FIG. 13 shows a principle sketch of a process flow of a method of producing a VCSEL according to the present disclosure.

In step 150, substrate 22 is provided. In step 152, the second part 26 of the second mirror 16 which may be a DBR, as described above, is provided on the substrate 22. In step 154, a light absorption region 20, as described above, is provided on the second part 26 of the second mirror 16. The step 154 includes separating the absorbing layers from one another by a distance d which satisfies the condition (1) as described herein. The step 154 may also include providing additional layers between the light absorbing layers of the absorption region 20, in particular one or more strain-compensating layers like layer 76 in FIG. 10.

In step 156, the third and second region 32 and 30 of the first part 24 of the second mirror 16, as described above, are provided on the light absorption region 20. In step 158, the first region 28 of the first part 24 of the second mirror 16 is provided on the second region 30. In step 160, the active region 14 as described above is provided on the first region 28 of the first part 24 of the second mirror 16. In step 162, the first mirror 12 is provided on top of the active region 14. In step 164, the optical resonator 18 comprising the first and second mirrors 12, 16 and the active region 14 is electrically contacted as described above. In step 166, the photodiode 34 is electrically contacted as described above.

Electrically contacting may comprise one or more steps of etching down the layer structure of the VCSEL 10 with an appropriate etching technology to the respective layer of the second region 30 of the first part 24 of the second mirror 16. The process may further comprise an oxidation process in order to provide an oxide aperture in the VCSEL 10. The production process may further comprise a passivation or planarization process to provide a smooth surface for depositing bond pads. The substrate 22 may be removed after depositing the semiconductor layers of the VCSEL structure. The n-contact 38 of the photodiode 34 may be provided after thinning or grinding the substrate 22 on the thinned backside of the substrate 22.

The above-mentioned layers of the layer stack of the VCSEL 10 may be deposited by epitaxial methods like MOCVD or MBE.

While the invention has been illustrated and described in detail in the drawings and foregoing description, such illustration and description are to be considered illustrative or exemplary and not limiting; the invention is not limited to the disclosed embodiments. Other variations to the disclosed embodiments can be understood and effected by those skilled in the art and practicing the claimed invention, from a study of the drawings, disclosure, and appended claims.

In the claims, the word "comprising" does not exclude other elements or steps, and the indefinite article "a" or "an" does not exclude a plurality. A single element or other unit may fulfill the functions of several items recited in the claims. The mere fact that certain measures are recited in mutually different claims does not indicate that a combination of these measures cannot be used to advantage.

Any reference signs in the claims should not be construed as limiting the scope.

While subject matter of the present disclosure has been illustrated and described in detail in the drawings and foregoing description, such illustration and description are to be considered illustrative or exemplary and not restrictive. Any statement made herein characterizing the invention is also to be considered illustrative or exemplary and not restrictive as the invention is defined by the claims. It will be understood that changes and modifications may be made, by those of ordinary skill in the art, within the scope of the following claims, which may include any combination of features from different embodiments described above.

The terms used in the claims should be construed to have the broadest reasonable interpretation consistent with the foregoing description. For example, the use of the article "a" or "the" in introducing an element should not be interpreted as being exclusive of a plurality of elements. Likewise, the recitation of "or" should be interpreted as being inclusive, such that the recitation of "A or B" is not exclusive of "A and B," unless it is clear from the context or the foregoing description that only one of A and B is intended. Further, the recitation of "at least one of A, B and C" should be interpreted as one or more of a group of elements consisting of A, B and C, and should not be interpreted as requiring at least one of each of the listed elements A, B and C, regardless of whether A, B and C are related as categories or otherwise. Moreover, the recitation of "A, B and/or C" or "at least one of A, B or C" should be interpreted as including any singular entity from the listed elements, e.g., A, any subset from the listed elements, e.g., A and B, or the entire list of elements A, B and C.

The invention claimed is:

1. A vertical cavity surface emitting laser (VCSEL) comprising:
    an optical resonator comprising a first mirror, an active region configured to generate laser light, and a second mirror, wherein the active region is arranged between the first mirror and the second mirror;
    a photodiode integrated in the optical resonator, the photodiode comprising an absorption region having a plurality of absorbing layers configured to absorb the generated laser light, wherein the absorbing layers are arranged spaced apart from one another by a center-to-center distance d which satisfies the condition $d=(2k-1)\lambda/(4\,m)$, wherein $\lambda$ is the wavelength of the laser light in the absorption region, and k and m are natural numbers $\geq 1$, wherein at least one first layer comprising AlGaAs or GaAs, at least one second layer comprising AlGaAs or GaAs, and at least one third layer comprising GaAsP sandwiched between the first layer and the second layer are arranged between at least one adjacent pair of the absorbing layers.

2. The VCSEL of claim 1, wherein the photodiode comprises an even number of the absorbing layers.

3. The VCSEL of claim 1, wherein the photodiode comprises at least two of the absorbing layers arranged spaced apart from one another by the center-to-center distance d, wherein k=1 and m=1.

4. The VCSEL of claim 1, wherein the photodiode comprises at least two of the absorbing layers arranged spaced apart from one another by the center-to-center distance d, wherein k=2 and m=1.

5. The VCSEL of claim 1, wherein the photodiode comprises at least four of the absorbing layers pairwise spaced apart from one another by the center-to-center distance d, wherein k=1 and m=2.

6. The VCSEL of claim 1, wherein the absorbing layers comprise strained semiconductor material.

7. The VCSEL of claim 6, wherein each of the absorbing layers has a layer thickness which is in a range from 25% to 200% of a critical layer thickness of the strained semiconductor layer.

8. The VCSEL of claim 6, wherein each of the absorbing layers has the layer thickness which is in the range from 70% to 100% of the critical layer thickness of the strained semiconductor layer.

9. The VCSEL of claim 1, wherein each of the absorbing layers has a layer thickness in a range from 5 nm to 50 nm.

10. The VCSEL of claim 1, wherein the absorbing layers comprise InGaAs.

11. The VCSEL of claim 1, wherein an emission wavelength of laser light configured to be output by the VCSEL is in a range from 850 nm to 1200 nm.

12. An optical sensor comprising the VCSEL according to claim 1.

13. The VCSEL of claim 1, wherein each of the absorbing layers has the layer thickness in the range from 10 nm to 35 nm.

14. A method of producing a vertical cavity surface emitting laser (VCSEL), the method comprising:
provi­ding an optical resonator comprising a first mirror, an active region configured to generate laser light, and a second mirror, wherein the active region is arranged between the first mirror and the second mirror;
integrating a photodiode in the optical resonator, the photodiode comprising an absorption region having at least two absorbing layers, arranging the absorbing layers spaced apart from one another by a center-to center distance d which satisfies the condition $d=(2k-1)\lambda/(4m)$, wherein $\lambda$ is the wavelength of laser light in the absorption region, and k and m are natural numbers $\geq 1$, and arranging at least one first layer, at least one second layer, and at least one third layer between at least one adjacent pair of absorbing layers, wherein the first layer comprises AlGaAs or GaAs, the second layer comprises AlGaAs or GaAs, and the third layer comprises GaAsP and is sandwiched between the first layer and the second layer.

* * * * *